United States Patent
Matsuyama et al.

(10) Patent No.: US 9,948,160 B2
(45) Date of Patent: Apr. 17, 2018

(54) MOTOR DEVICE (71) Applicant: DENSO CORPORATION, Kariya, Aichi-pref. (JP)

(72) Inventors: Takuya Matsuyama, Kariya (JP); Kazuyuki Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/608,381

(22) Filed: May 30, 2017

(65) Prior Publication Data
US 2018/0006525 A1    Jan. 4, 2018

(30) Foreign Application Priority Data
Jul. 1, 2016  (JP) ................................. 2016-131713

(51) Int. Cl.
| | |
|---|---|
| *H02K 5/24* | (2006.01) |
| *H02K 33/10* | (2006.01) |
| *H02K 7/18* | (2006.01) |
| *H02K 5/06* | (2006.01) |
| *H05K 1/02* | (2006.01) |

(Continued)

(52) U.S. Cl.
CPC ................. *H02K 5/24* (2013.01); *H02K 5/06* (2013.01); *H02K 7/1892* (2013.01); *H02K 33/10* (2013.01); *H05K 1/0228* (2013.01); *H02K 5/02* (2013.01); *H02K 7/20* (2013.01); *H05K 1/0209* (2013.01)

(58) Field of Classification Search
CPC .......... H02K 5/24; H02K 33/10; H02K 37/04; H05K 1/117
USPC ....................................................... 318/466
See application file for complete search history.

(56) References Cited

U.S. PATENT DOCUMENTS

| | | | | |
|---|---|---|---|---|
| 8,973,543 B2* | 3/2015 | Hayashi | ................... | F01L 1/344 |
| | | | | 123/90.17 |
| 8,991,346 B2* | 3/2015 | Kinouchi | .............. | F01L 1/3442 |
| | | | | 123/90.17 |
| 9,103,241 B2* | 8/2015 | Hayashi | ................ | F01L 1/3442 |

(Continued)

FOREIGN PATENT DOCUMENTS

| | | | | | |
|---|---|---|---|---|---|
| JP | 2009121292 A | * | 6/2009 | .............. | F01L 1/352 |
| JP | 3191032 U | | 5/2014 | | |

(Continued)

OTHER PUBLICATIONS

U.S. Appl. No. 15/607,987, filed May 30, 2017, Matsuyama et al.
U.S. Appl. No. 15/607,816, filed May 30, 2017, Ishimoto et al.
U.S. Appl. No. 15/608,259, filed May 30, 2017, Watanabe.

*Primary Examiner* — Kawing Chan
(74) *Attorney, Agent, or Firm* — Posz Law Group, PLC (57) ABSTRACT

A base of a case has an inner groove portion, which surrounds a circuit board, and an outer groove portion. A first projected portion of a connector is inserted in the inner groove portion via a first seal portion. A second projected portion of the connector is inserted in the outer groove portion via a second seal portion. The first seal portion and the second seal portion are formed of the same material and are interposed between a periphery of an opening of the case and the connector. The first seal portion in the inner groove portion is in contact with the first projected portion of the connector to water tightly seal an accommodation space formed in the case. The second seal portion in the outer groove portion is in contact with the second projected portion of the connector to restrict vibration of the connector.

7 Claims, 7 Drawing Sheets (51) Int. Cl.
  *H02K 7/20*   (2006.01)
  *H02K 5/02*   (2006.01)

(56) References Cited

U.S. PATENT DOCUMENTS

| | | |
|---|---|---|
| 9,103,242 B2* | 8/2015 | Sugiura .................. F01L 1/352 |
| 9,115,612 B2* | 8/2015 | Hayashi ................ F01L 1/3442 |
| 2009/0068862 A1 | 3/2009 | Honda |
| 2009/0121671 A1 | 5/2009 | Uehama et al. |
| 2014/0084834 A1 | 3/2014 | Saito |
| 2014/0216202 A1* | 8/2014 | Tadokoro ................ F16H 25/10 |
| | | 74/568 R |
| 2014/0230763 A1* | 8/2014 | Watanabe ............... F01L 1/344 |
| | | 123/90.15 |
| 2015/0282362 A1 | 10/2015 | Nuriya et al. |

FOREIGN PATENT DOCUMENTS

| | | |
|---|---|---|
| JP | 2015-177557 A | 10/2015 |
| JP | 2015-203392 A | 11/2015 |
| JP | 2016-073118 A | 5/2016 |

\* cited by examiner

MOTOR DEVICE

CROSS REFERENCE TO RELATED APPLICATION

This application is based on Japanese Patent Application No. 2016-131713 filed on Jul. 1, 2016, the disclosure of which is incorporated herein by reference.

TECHNICAL FIELD

The present disclosure relates to a motor device.

BACKGROUND

Patent Literature 1 discloses a motor device including a case, a motor, and a control circuit portion. The case includes a cover and a metallic base. The motor is located on one side of the base. The control circuit portion is accommodated in the case and is affixed to a rear side of the base. The rear side is on the opposite side of the one side of the base. This kind of the motor device is applied to, for example, a valve timing control apparatus configured to control a valve timing of an internal combustion engine by using rotation of the motor.

(Patent Literature 1)

Publication of Japanese unexamined patent application No. 2009-121292

A control circuit portion is, in general, configured as a circuit board, which is constructed by mounting electronic components on a printed circuit board. The circuit board is electrically connected with a motor. The printed circuit board is mounted with a connector. A part of the connector is projected to the outside through an opening, which is formed with a base and a cover. The present configuration enables electrical connection between the circuit board with an external device. In addition, in order to water-tightly seal an accommodation space, which is formed in the case, a sealing member is interposed at an opposed portion between the base and the cover and at an opposed portion between a periphery of the opening of the case and the housing.

The inventor has noted that the connector, which is mounted on the printed circuit board, is affixed to the case via the sealing member in a conventional motor device. As described above, the connector is projected to the outside through the opening. Therefore, vibration of the motor is transmitted to the base via the connector. Thus, the configuration may raise vibration in the connector. Ablation may arise in the terminal of the connector due to transmission of vibration.

It is conceivable to equip a vibration suppression member, such as a rubber member, between the connector and the case in order to restrict vibration of the connector. However, additional vibration suppression member may increase a number of components and may increase a manufacturing process.

SUMMARY

It is an object of the present disclosure to produce a motor device configured to restrict vibration of a connector with a simple configuration.

According to an aspect of the present disclosure, a motor device comprises a case including a base and a cover. The base is formed of a metallic material having a one side and a rear side, which is on an opposite side of the one side. The cover defines an accommodation space with the base. The base and the cover define an opening of the case. The motor device further comprises a motor located at the one side of the base. The motor device further comprises a circuit board located in the accommodation space and electrically connected with the motor. The circuit board includes a printed circuit board and an electronic component, which is mounted on the printed circuit board. The motor device further comprises a connector including a plurality of terminals and a housing. The terminals are mounted on the printed circuit board. The housing supports the terminal and partially projects through the opening of the case to an outside. The motor device further comprises a sealing member interposed at an opposed portion between the base and the cover and at an opposed portion between a periphery of the opening of the case and the housing of the connector. The base includes an inner groove portion and an outer groove portion. The inner groove portion is formed in the rear side of the base to surround both the circuit board and a connecting portion between the circuit board and the motor. The outer groove portion is formed in the rear side of the base and located outside the inner groove portion. The outer groove portion is located at an opposed portion between the base and the housing of the connector. The housing of the connector includes a first projected portion and a second projected portion. The first projected portion is inserted in an inserted portion of the inner groove portion, which is opposed to the housing. The second projected portion is inserted in the outer groove portion, The sealing member includes a first seal portion and a second seal portion, which are formed of a same material. The first seal portion is equipped to the inserted portion and is in contact with the first projected portion to water-tightly seal the accommodation space. The second seal portion is equipped to the outer groove portion and is in contact with the second projected portion to restrict vibration of the connector.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

As follows, multiple embodiments will be described with reference to drawings. In multiple embodiments, the same referential numeral will be denoted to an element, which functionally and/or structurally corresponds to another element.

First Embodiment

To begin with, an overview of a valve timing control apparatus will be described with reference to FIG. 1. The valve timing control apparatus is applied with a motor device according to the present embodiment.

Figure 1:
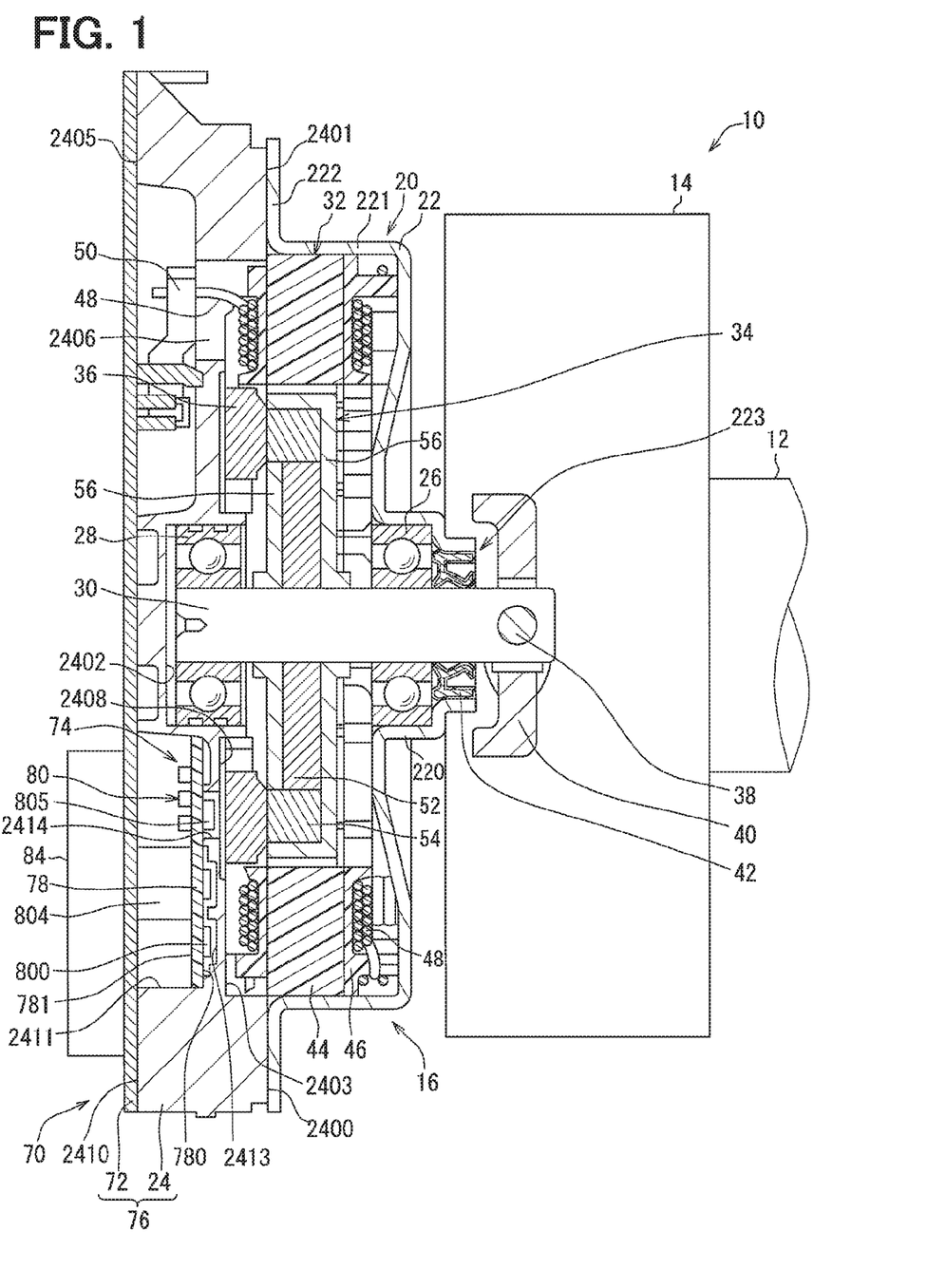
FIG. 1 is a sectional view showing a configuration of a valve timing control apparatus to which a motor device according to the first embodiment is applied.

As shown in FIG. 1, a valve timing control apparatus 10 is used in a transmission system which transmits crank torque from a crank axis of an internal combustion engine (not shown) to a camshaft 12 in a vehicle. The camshaft 12 receives transmission of the crank torque to open and close an intake valve of a movable valve (not shown) of the internal combustion engine. The valve timing control apparatus 10 controls a valve timing of the intake valve by using a motor 20, as described later.

The valve timing control apparatus 10 includes a phase control mechanism 14 and a motor device 16. The configuration of the phase control mechanism 14 may be substantially equivalent to the configuration disclosed in Japanese published unexamined application No. 2015-203392. Therefore, the configuration of the phase control mechanism 14 may be referred to the description of Japanese published unexamined application No. 2015-203392. Therefore, FIG. 1 illustrates the phase control mechanism 14 as simplified. Herein, detailed description of the phase control mechanism 14 is omitted.

Subsequently, overview of the motor device 16 will be described with reference to FIGS. 1 to 10. In FIG. 6, in order to show the position of the heat dissipation gel 88 relative to a circuit board 74, the dashed line shows the outline of the heat dissipation gel 88. FIG. 10 is a sectional view showing the actuating device 70 taken along the line X-X in FIG. 5. In FIG. 10, illustration of the terminal 840 of a connector 84 is omitted.

As shown in FIG. 1, the motor device 16 includes a motor 20 and an actuating device 70. The motor device 16 may be also referred to as a rotary electric device accommodating an actuating device 70 (electronic driver unit: EDU).

Figure 2:
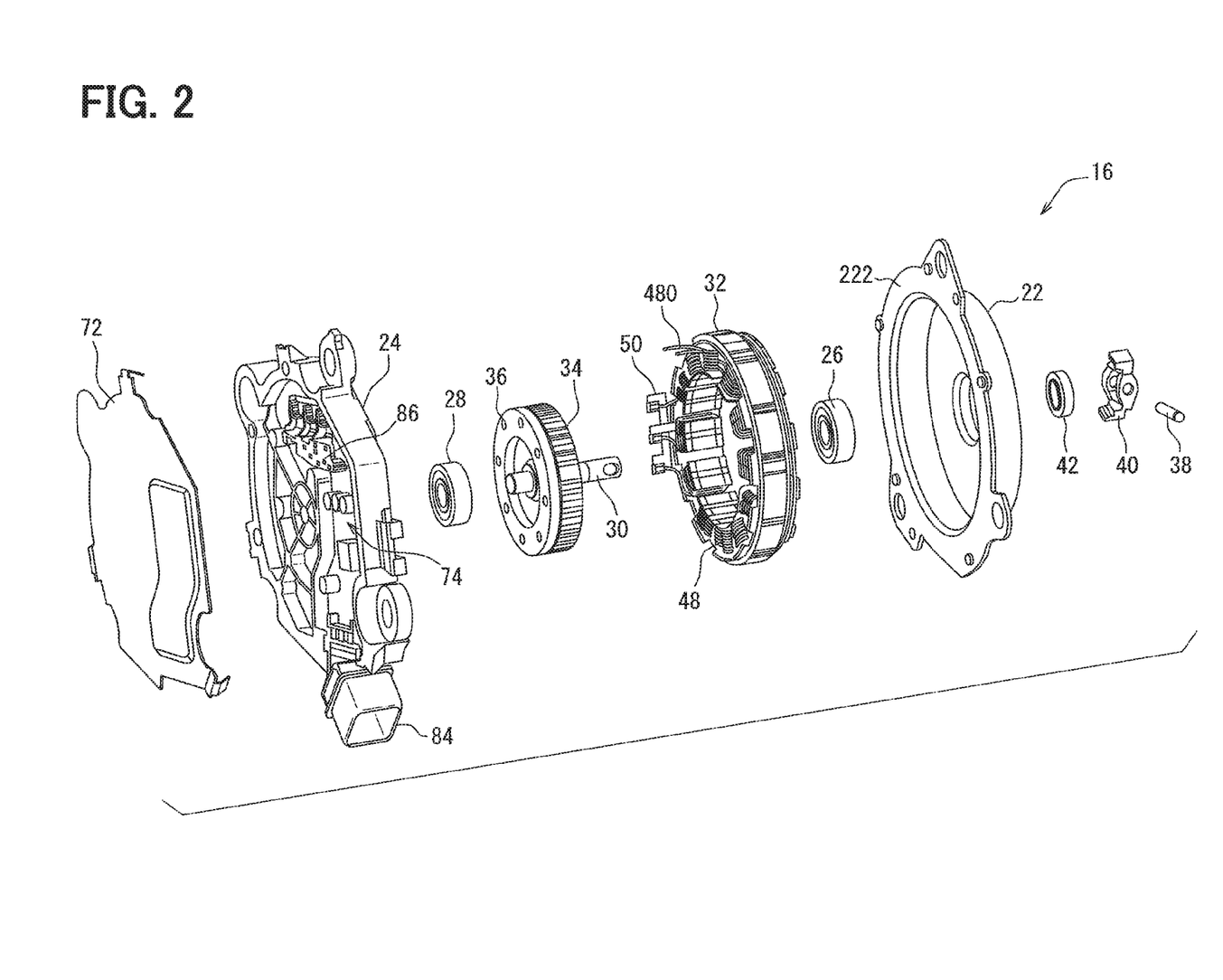
FIG. 2 is an exploded perspective view showing the configuration of the motor device.

The motor 20 is a brushless permanent magnet type synchronous motor. As shown in FIGS. 1 and 2, the motor 20 includes a housing 22, a base 24, bearings 26 and 28, a motor axis 30, a stator 32, a rotor 34, and a sensor magnet 36.

The housing 22 is formed of a metallic material, such as a ferrous material, to be substantially in a bottomed tubular shape. The base 24 is formed of an aluminum material to be substantially in a circular plate shape. The base 24 is equipped to cover the housing 22. The housing 22 is mounted to the base 24 to form an accommodation space. The accommodation space contains other elements 26, 28, 30, 32, 34, and 36 of the motor 20. In this way, the housing 22 and the base 24 form a case of the motor 20. In the internal combustion engine, the housing 22 and the base 24 are mounted to a stationary component, such as a chain cover.

As shown in FIG. 1, the housing 22 includes a small diameter portion 220, a large diameter portion 221, and a flange portion 222. The small diameter portion 220 is equipped on the side of a phase control mechanism 14 in an axial direction of the motor axis 30. Hereinafter, the axial direction of the motor axis 30 will be simply referred to as an axial direction. The large diameter portion 221 is equipped on the side of the actuating device 70. The large diameter portion 221 is larger than the small diameter portion 220 in diameter. The flange portion 222 is connected to an end of the large diameter portion 221 on the side of the actuating device 70. The flange portion 222 is extended radially outward. The flange portion 222 is equipped to an outer periphery portion 2401 of a one side 2400 of the base 24 on the side of the phase control mechanism 14. A sealing member (not shown) is equipped between the outer periphery portion 2401 and the flange portion 222 in order to seal an accommodation space formed between the housing 22 and the base 24 in a waterproof manner. The sealing member may be formed of, for example, an adhesion material having a humidity-hardening property and containing, for example, silicone as a main component.

Each of bearings 26 and 28 supports the motor axis 30 to enable the motor axis 30 to rotate in a normal direction and a reverse direction. An outer ring of the bearing 26 on the side of the phase control mechanism 14 in the axial direction is affixed to an inner surface of the small diameter portion 220 of the housing 22. An inner ring of the bearing 26 is affixed to the motor axis 30. The bearing 26 is substantially entirely located inside the small diameter portion 220 in the axial direction.

Figure 3:
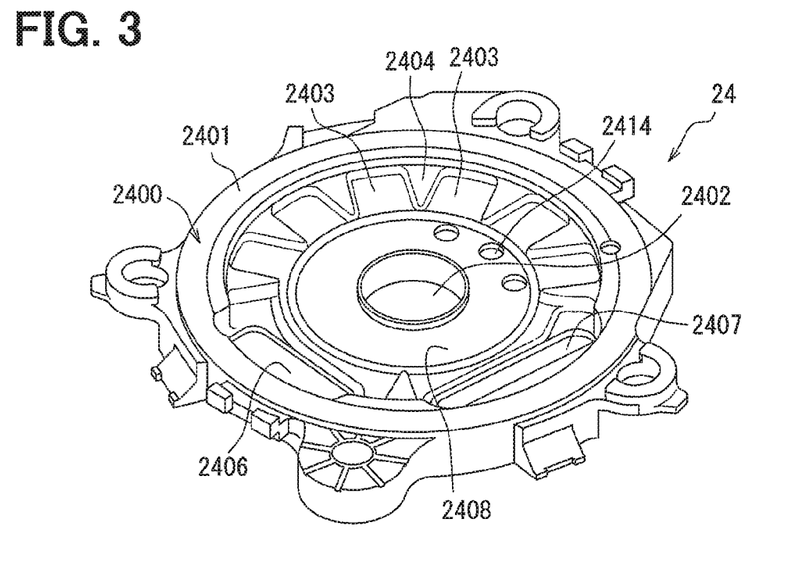
FIG. 3 is a perspective view showing a base viewed from the side of a motor.

As shown in FIGS. 1 and 3, the base 24 has a first recessed portion 2402 in the one side 2400. The first recessed portion 2402 is recessed relative to the outer periphery portion 2401. The first recessed portion 2402 is formed correspondingly to the bearing 28 and the motor axis 30. The first recessed portion 2402 is located close to the center of the base 24, which is substantially in a circular plate shape. The first recessed portion 2402 has the depth, which is ½ or more of the thickness of the base 24. The bearing 28 and one end of the motor axis 30 are accommodated in the first recessed portion 2402. More specifically, the outer ring of the bearing 28 is affixed to the inner circumferential periphery of the first recessed portion 2402. The inner ring of the bearing 28 is affixed to the motor axis 30. The bearing 28 supports the one end of the motor axis 30 such that the one end does not make contact with the base 24.

The housing 22 has an opening 223, which is formed close to the center of the bottom portion of the housing 22. The motor axis 30 projects through the opening 223 to the outside of the housing 22. The motor axis 30 is connected with the phase control mechanism 14. A through hole is formed in an end of the motor axis 30 on the side of the phase control mechanism 14. As shown in FIGS. 1 and 2, the pin 38 is inserted through the through hole. In this way, the joint 40, which is to be connected with the phase control mechanism 14, is affixed to the motor axis 30. In addition, an annular sealing member 42 is interposed between the inner periphery of the opening 223 of the housing 22 and the motor axis 30. As the sealing member 42, for example, an oil seal is used. The sealing member 42 is located closer to the phase control mechanism 14 than the bearing 26.

The stator 32 is located on the side of the one side 2400 of the base 24. The stator 32 is formed in a tubular shape. The stator 32 includes multiple stator cores 44 and multiple windings 48. The stator cores 44 include multiple teeth portions, respectively. The windings 48 are wound around resin bobbins 46 via teeth portions, respectively. Each of the stator cores 44 is formed by stacking metal pieces. The stator cores 44 are arranged at a regular interval along a circumferential direction, which is a rotational direction of the motor axis 30. The windings 48 are individually wound around the corresponding stator cores 44, respectively. That is, the windings 48 are also arranged along the circumferential direction at the regular interval. The windings 48 corresponding to the U phase, the V phase, and the W phase of the motor 20 are connected to each other through the terminal 50 for forming a neutral point. The winding 48 are supplied with a driving current via a contact 86, which will be described later. In this way, the stator 32 is caused to generate a rotational magnetic field, which acts on permanent magnets 54 of the rotor 34, which will be described later. The stator 32 is supported by the housing 22.

As shown in FIG. 3, the base 24 includes multiple second recessed portions 2403 and multiple reinforcement portions 2404. The second recessed portions 2403 are recessed relative to the outer periphery portion 2401 in the one side 2400. The second recessed portions 2403 are formed correspondingly to the windings 48 of the stator 32, respectively. That is, the second recessed portions 2403 are formed at a regular interval in the circumferential direction. The second recessed portions 2403 accommodate the corresponding windings 48, respectively. The second recessed portions 2403 are shallower than the first recessed portion 2402 in the axial direction.

The reinforcement portion 2404 is equipped between the second recessed portions 2403, which are adjacent to the reinforcement portion 2404 in the circumferential direction. That is, the second recessed portions 2403 and the reinforcement portions 2404 are arranged alternately in the circumferential direction. The reinforcement portion 2404 partitions the second recessed portions 2403 into multiple regions. The reinforcement portion 2404 is shallower than the bottom surface of the second recessed portion 2403 in the one side 2400. The reinforcement portion 2404 is slightly recessed relative to the outer periphery portion 2401. Thus, the reinforcement portion 2404 in the present configuration enables to enhance rigidity of the base 24, compared with a configuration where the second recessed portion 2403 in a circular shape is formed.

Figure 4:
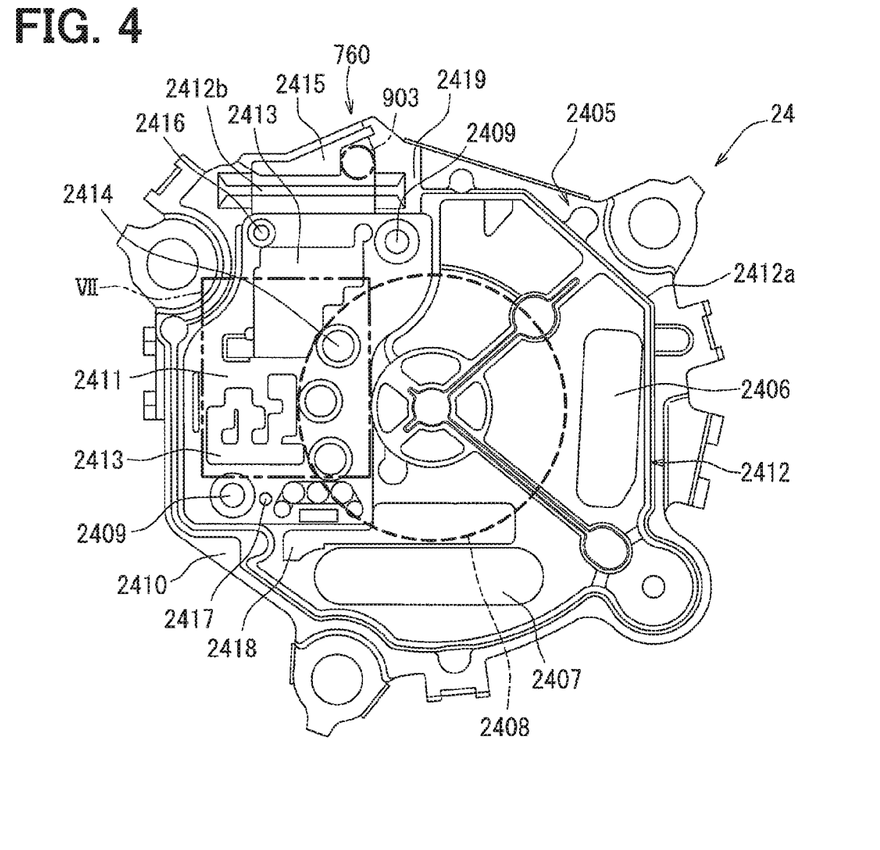
FIG. 4 is a plan view showing the base viewed from the side of a circuit board.

As shown in FIGS. 1, 3, and 4, the base 24 has through holes 2406 and 2407 each extending from the one side 2400 to the rear side 2405, which is on the opposite side of the one side 2400, through the base 24. The through hole 2406 is formed to enable the neutral point of the motor 20 to protrude from the one side 2400 to the rear side 2405. The neutral point of the motor 20 is the joint portion among the terminal 50 and the windings 48 in the all phases. The through hole 2407 is formed to enable to electrically connect the terminal 860 of the contact 86 with a joint portion 480 of the winding 48 in each phase by, for example, welding.

The rotor 34 is rotatably accommodated inside the stator 32 which is in the tubular shape. The rotor 34 is in a disc shape projected radially outward from the motor axis 30. The rotor 34 is rotatable in the circumferential direction in both the normal direction and the reverse direction. The rotor 34 includes a rotor core 52, multiple permanent magnets 54, and a stationary plate 56. The rotor core 52 is formed by stacking two or more disc-shaped core sheets. The multiple permanent magnets 54 are rotational integrally with the rotor core 52. The stationary plate 56 is formed on both ends of the rotor core 52 in the axial direction. The rotor core 52 may be affixed directly to the motor axis 30 or may be affixed to the motor axis 30 via a fitting member. The multiple permanent magnets 54 have different magnetic poles alternately in the circumferential direction.

The sensor magnet 36 is in a ring shape. The sensor magnet 36 is affixed to an outer circumferential peripheral end of the rotor 34 on the side of the base 24. The sensor magnet 36 is rotatable integrally with the rotor 34. The sensor magnet 36 is equipped to detect the rotary position of the rotor 34, i.e., the rotational angle of the motor 20. The sensor magnet 36 is alternately magnetized with an N pole and an S pole at a predetermined angular interval.

As shown in FIGS. 1 and 3, the base 24 has a third recessed portion 2408 in the one side 2400. The third recessed portion 2408 is recessed relative to the outer periphery portion 2401. The third recessed portion 2408 is formed substantially in an annular shape correspondingly to the sensor magnet 36. The third recessed portion 2408 accommodates the sensor magnet 36. The third recessed portion 2408 is shallower than the first recessed portion 2402 and is deeper than the second recessed portion 2403 in the axial direction. The first recessed portion 2402, the third recessed portion 2408, the second recessed portion 2403, and the outer periphery portion 2401 are arranged in this order from the axial center of the motor axis 30 to the radially outside.

The actuating device 70 includes a cover 72, the circuit board 74, the connector 84, and the contact 86. The base 24 is also a component of the actuating device 70. The base 24 serves for both the motor 20 and the actuating device 70.

The cover 72 is formed of a metallic material, such as a ferrous material, to be substantially in a circular plate shape. The cover 72 is located on the side of the rear side 2405 of the base 24. The circuit board 74 is located in the accommodation space, which is formed by mounting the cover 72 to the base 24. The base 24 and the cover 72 form a case 76, which accommodates the circuit board 74.

The circuit board 74 includes a printed circuit board 78 and multiple electronic components 80. The multiple electronic components 80 are mounted on the printed circuit board 78. The printed circuit board 78 includes a base member and a wiring. The base member contains resin as a material. The wiring is equipped to the base member. The printed circuit board 78 has a one side 780 and a rear side 781. The one side 780 is opposed to the base 24 in the axial direction. The rear side 781 is a surface on the opposite side of the one side 780 in its thickness direction. The thickness direction of the printed circuit board 78 substantially coincides with the axial direction of the motor axis 30.

Figure 5:
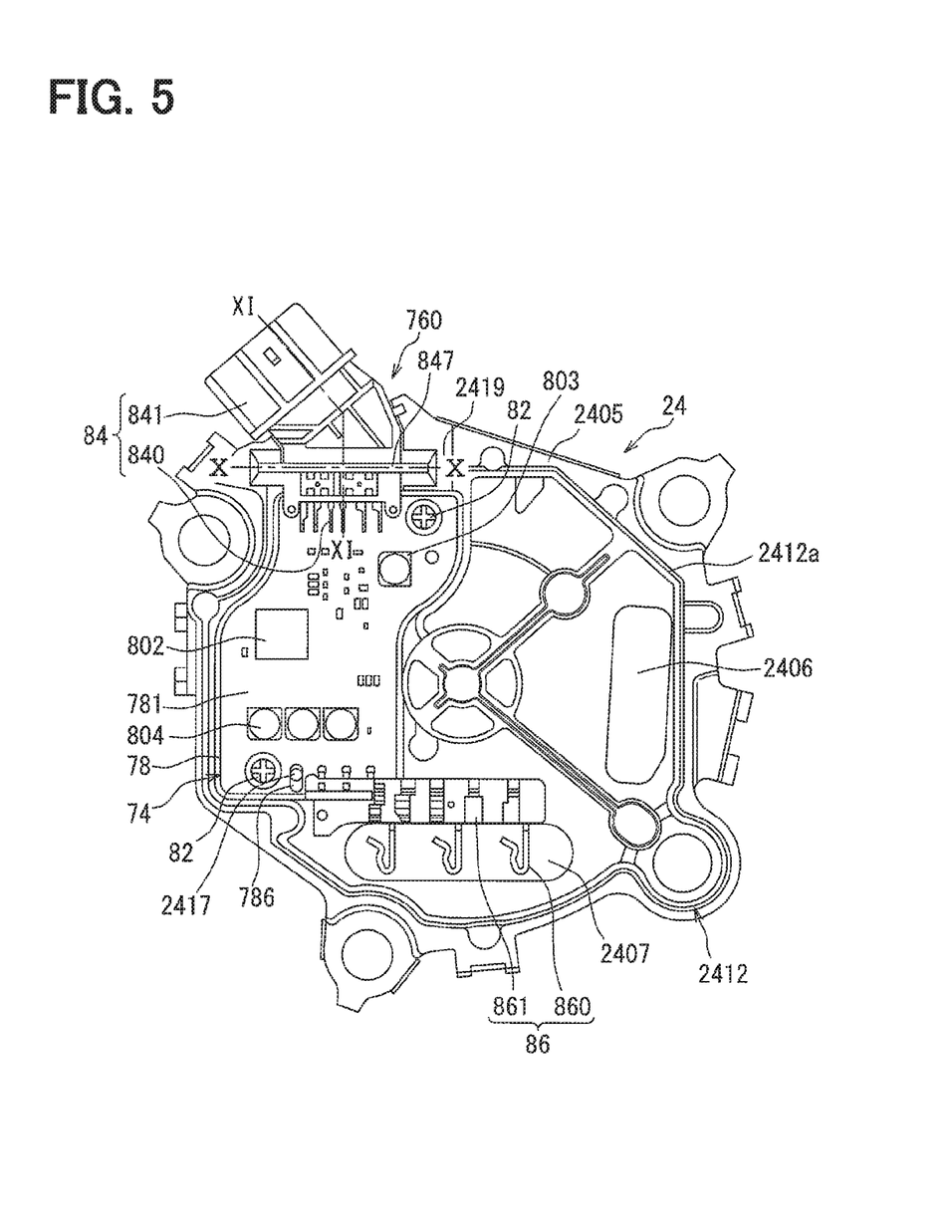
FIG. 5 is a plan view showing a state where the circuit board is affixed to the base.
Figure 6:
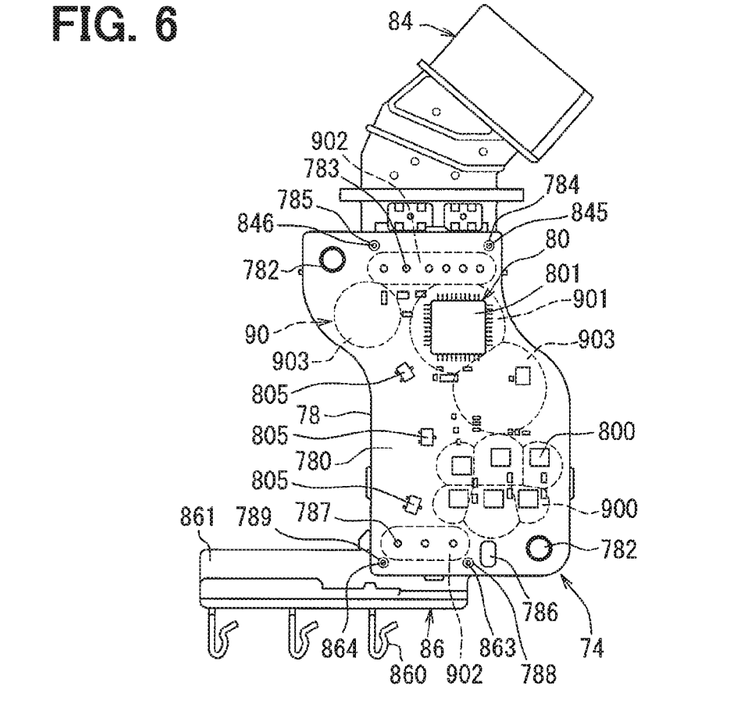
FIG. 6 is a plan view showing the circuit board.

As shown in FIGS. 1 and 5, the printed circuit board 78 is located on the rear side 2405 of the base 24. As shown in FIGS. 5 and 6, the printed circuit board 78 is substantially in a crank form. The printed circuit board 78 is equipped to the rear side 2405, such that the printed circuit board 78 does not overlap with the first recessed portion 2402 in a projection view along the axial direction. That is, the printed circuit board 78 is equipped to circumvent the bearing 28 and the motor axis 30. As shown in FIG. 5, the printed circuit board 78 is affixed to the base 24 with two screws 82. As shown in FIG. 6, the printed circuit board 78 has through holes 782, which are formed at the diagonal positions corresponding to the screws 82. As shown in FIG. 4, the base 24 has screw holes 2409, which are formed correspondingly to the screws 82.

As shown in FIGS. 1 and 4, the base 24 has an outer periphery portion 2410 and a fourth recessed portion 2411 in the rear side 2405. The outer periphery portion 2410 is mounted with the cover 72. The fourth recessed portion 2411 is recessed relative to the outer periphery portion 2410 in the axial direction. The fourth recessed portion 2411 is formed correspondingly to the circuit board 74. The circuit board 74 is mostly accommodated in the fourth recessed portion 2411. An inner groove portion 2412 is formed in the outer periphery portion 2410 to surround the circuit board 74 and a joint portion between the circuit board 74 and the motor 20. That is, the inner groove portion 2412 is formed at a position to enable to seal the accommodation space of the case 76 water-tightly. Details of the inner groove portion 2412 will be described later.

The multiple electronic components 80 are mounted on both the one side 780 and the rear side 781 of the printed circuit board 78. The electronic components 80 include MOSFETs 800, a driver IC 801, a coil 802, capacitors 803 and 804 and/or the like. The electronic components 80 are elements forming a circuit to drive the motor 20 together with the wiring of the printed circuit board 78. The MOSFETs 800 form a three-phase inverter to drive the motor 20. More specifically, six MOSFETs 800, which form a three-phase inverter, are mounted on the one side 780 of the printed circuit board 78. The three-phase inverter includes upper arms and lower arms corresponding to three phases. The upper arms of three phases are connected to a high potential power source line. The lower arms of the three phases are connected to a low potential power source line.

The driver IC 801 detects the rotary position of the rotor 34 according to a detection signal of hall elements 805, which will be described later. The driver IC 801 acquires, from a microcomputer of an ECU (not shown), a signal to instruct the rotational direction and the revolution of the motor 20. The driver IC 801 generates a gate driving signal for each of the MOSFETs 800 according to the instruction signal and the rotary position. Thus, the driver IC 801 sends the gate driving signal to each of the MOSFETs 800.

Figure 7:
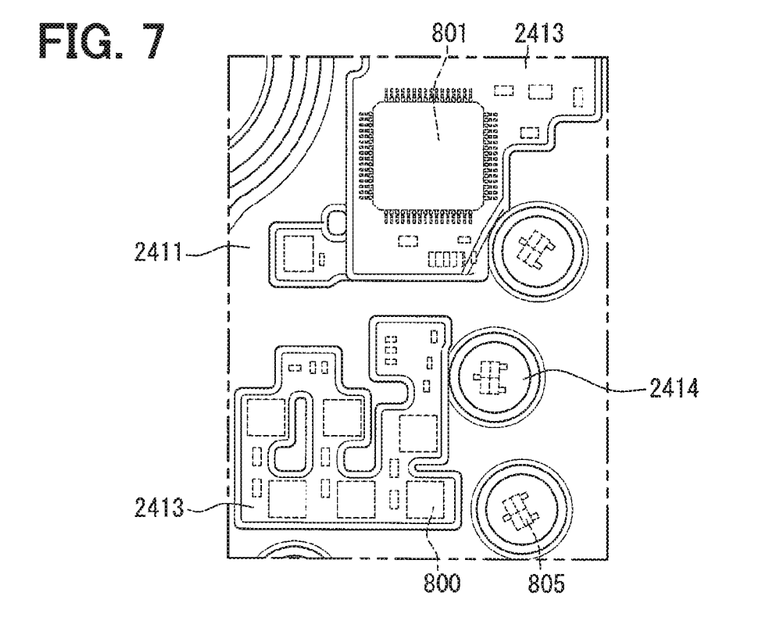
FIG. 7 is a view showing a physical relationship between the base and the electronic component in a region shown by a two-point chain line VII in FIG. 4.

As shown in FIGS. 1, 4, and 7, the base 24 has fifth recessed portions 2413 in the rear side 2405. Each of the fifth recessed portion 2413 is further recessed relative to the bottom surface of the fourth recessed portion 2411. The fifth recessed portions 2413 are formed correspondingly to at least a part of the electronic components 80, which are located on the one side 780 of the printed circuit board 78, excluding the hall elements 805. In FIG. 7, in order to show the physical relationship of the base 24 and the electronic components 80, the electronic components 80 are illustrated with the dashed line.

The fifth recessed portions 2413 are formed correspondingly to the MOSFETs 800 and the driver IC 801, respectively. As shown in FIG. 4, the fifth recessed portions 2413 are formed at positions, which do not overlap with the third recessed portion 2408 in a projection view along the axial direction. That is, the fifth recessed portions 2413 are formed at positions, which do not overlap with sensor magnet 36. In FIG. 4, the dashed line shows, as a reference line, the outer circumferential periphery of the third recessed portion 2408 formed in the one side 2400. In the present embodiment, a part of the MOSFETs 800 is accommodated in the fifth recessed portion 2413 in the axial direction.

The coil 802 and the capacitors 803 and 804 are mounted on the rear side 781 of the printed circuit board 78. The coil 802 and the capacitors 803 and 804 are tall components, which are taller than other elements of the electronic components 80 in the axial direction. The coil 802 and the capacitor 803 form a noise filter. The capacitor 804 is a smoothing capacitor. In the present embodiment, three capacitors 804 are mounted on the printed circuit board 78 for stabilization. The capacitor 804 is mounted on a rear surface portion of a mounting region where the multiple MOSFETs 800 are mounted in the printed circuit board 78.

The hall elements 805 are also mounted as the electronic component 80 on the printed circuit board 78. Each of the hall elements 805 detects the rotary position of the rotor 34 and sends the detection signal to the driver IC 801. The hall elements 805 are mounted on the one side 780 in the printed circuit board 78. The hall elements 805 are equipped correspondingly to the sensor magnets 36. In the present embodiment, the hall elements 805 include three elements equipped at a predetermined rotation angular interval along the circumferential direction.

The base 24 has through holes 2414, each of which extends from the one side 2400 to the rear side 2405 through the base 24. The through holes 2414 are formed correspondingly to the hall elements 805. Each of the hall elements 805 is individually accommodated in corresponding one of the through holes 2414. The present configuration, in which the hall elements 805 are equipped in the through holes 2414, respectively, enables to downsize the motor device 16 in the axial direction. In addition, the present configuration further enables to avoid decrease in the sensor sensitivity caused by an eddy current arising in the metallic base 24. The through holes 2414 are formed in the bottom surface of the third recessed portion 2408.

Figure 8:
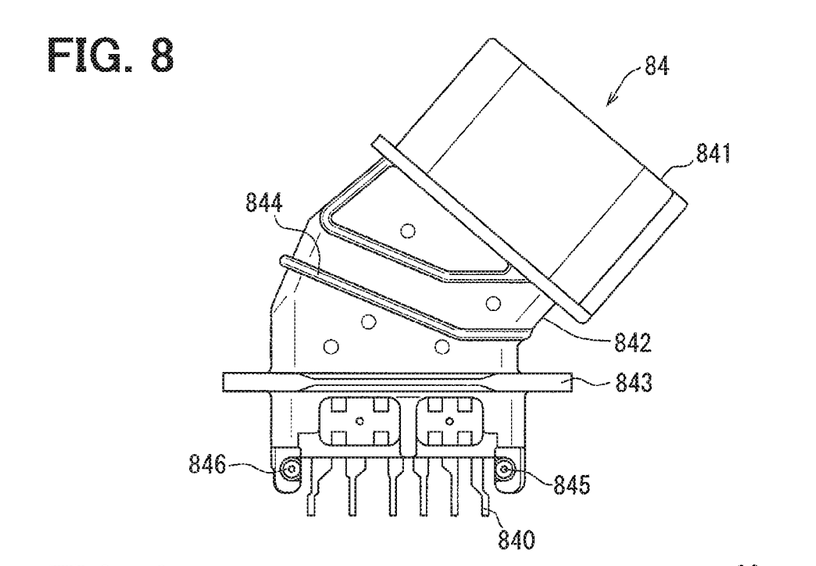
FIG. 8 is a plan view showing a connector.

As shown in FIGS. 5, 6, and 8, the connector 84 includes multiple terminals 840 and a housing 841. The multiple terminals 840 are formed of a conductive material such as phosphor bronze. The housing 841 is formed of resin as a forming material. The housing 841 retains the terminals 840. A part of the connector 84 is projected to the outside through an opening 760 of the case 76. The opening 760 of the case 76 is formed with the base 24 and the cover 72. FIGS. 4 and 5 illustrate only a portion of the opening 760 on the side of the base 24.

The terminal 840 is soldered at one-end in a state where the terminals 840 are inserted in the through holes 783 of the printed circuit board 78. The terminals 840 are configured to be connected with an external device at the other-end side. The terminal 840 electrically relays the ECU with the driver IC 801. More specifically, the microcomputer of the ECU (not shown) sends an instruction signal of the motor 20 to the circuit board 74 via the connector 84. In addition, the ECU further receives a diagnostic signal, which is sent from the circuit board 74, and a signal, which represents an actual revolution speed and an actual rotational direction of the motor 20, via the connector 84. The circuit board 74 is supplied with an electric power from an electric power source via the connector 84.

The housing 841 is mainly located around the rear side 781 of the printed circuit board 78. As shown in FIG. 8, the housing 841 includes a body portion 842, a first projected portion 843, and a second projected portion 844. The body portion 842 supports the terminals 840. The first projected portion 843 is projected from the body portion 842 toward the base 24. The first projected portion 843 is inserted in the connector opposed portion 2412b of the inner groove portion 2412, which will be described later. The second projected portion 844 is projected from the body portion 842 toward the base 24. The second projected portion 844 is inserted in the outer groove portion 2415, which will be described later. Furthermore, the housing 841 has protrusions 845 and 846 projected from the body portion 842 toward the base 24.

As shown in FIG. 8, the body portion 842 is substantially in a V-shape in a plan view. The second projected portion 844 extends from one end of the body portion 842 to the other end of the body portion 842 to straddle over the multiple terminals 840 at a position around a bent point at which the body portion 842 is bent to be in the V-shape. The first projected portion 843 is located at a position closer to a connecting portion, at which the multiple terminals 840 are connected with the circuit board 74, than the second projected portion 844. The first projected portion 843 is extended along an array direction, along which the multiple terminals 840 are arranged, so as to straddle over the multiple terminals 840. The rear side 2405 of the base 24 has the outer groove portion 2415. The outer groove portion 2415 is formed in an opposed portion of the rear side 2405, which is opposed to the housing 841, The opposed portion of the rear side 2405 is outside the inner groove portion 2412. Details of a seal configuration of the case 76 and a vibration regulating configuration of the connector 84 will be described later.

The protrusions 845 and 846 are formed at locations close to one end of the body portion 842. More specifically, the protrusions 845 and 846 are formed at locations close to one ends of the terminals 840, which are closer to a connecting portion with the circuit board 74 than the other ends of the terminals 840. The protrusions 845 and 846 are formed on both sides of the connecting portion of the body portion 842 at which the terminals 840 are connected with the circuit board 74.

The protrusion 845 has a projection length, which is larger than a projection length of the protrusion 846. As shown in FIG. 6, the printed circuit board 78 has through holes 784 and 785, which are formed correspondingly to the protrusions 845 and 846. The protrusion 845 is inserted in the through hole 784, and the protrusion 846 is inserted in the through hole 785. In this way, the connector 84 is positioned relative to the circuit board 74 (printed circuit board 78).

The base 24 has a hole portion 2416, which is formed corresponding to the protrusion 845. The hole portion 2416 opens in the rear side 2405. The protrusion 845 extends through the through hole 784. The protrusion 845 has a tip end portion, which is inserted through the through hole 784. The tip end portion of the protrusion 845 is further inserted into the hole portion 2416. The protrusion 845 is directly in contact with a sidewall of the hole portion 2416. To the contrary, as described above, the protrusion 846 is shorter than the protrusion 845. In this way, the protrusion 846 is restricted from interfering with the base 24. That is, the base 24 does not have a hole portion, which corresponds to the protrusion 846.

In addition, the printed circuit board 78 has a through hole 786, which is in an elongated hole shape. The base 24 has a protrusion 2417, which corresponds to the through hole 786. In present embodiment, the through hole 786 has a circumferential length (width), which is the length in the circumferential direction centered on the through hole 784. The through hole 786 has a radial length (height), which is in the radial direction centered on the through hole 784. The radial length (height) is larger than the circumferential length (width). In addition, the through hole 784 is formed on the one-end side in the longitudinal direction of the printed circuit board 78. The through hole 786 is formed on the other-end side in the longitudinal direction of the printed circuit board 78. The present structure enables to secure a long distance between the through holes 784 and 786. The protrusion 2417 is projected from the rear side 2405 toward the circuit board 74. The protrusion 2417 is inserted in the through hole 786. The protrusion 2417 and the wall surface of the through hole 786 have a small clearance therebetween in the circumferential direction. In present embodiment, the protrusion 2417 is in a trapezoidal conical shape, which is a conical shape having a trapezoidal cross section. In addition, the protrusion 2417 is inserted through the through hole 786.

Figure 9:
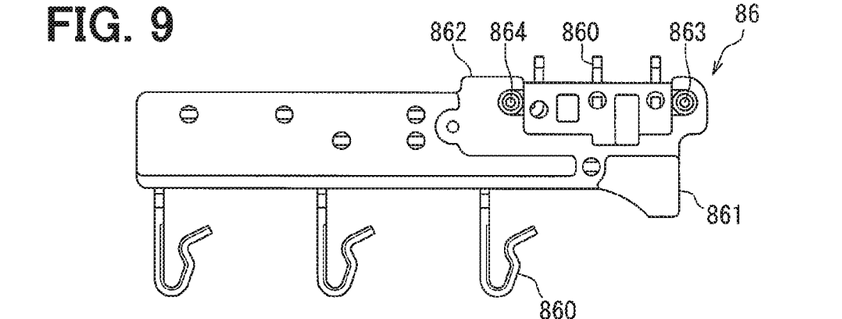
FIG. 9 is a plan view showing a contact.
Figure 10:
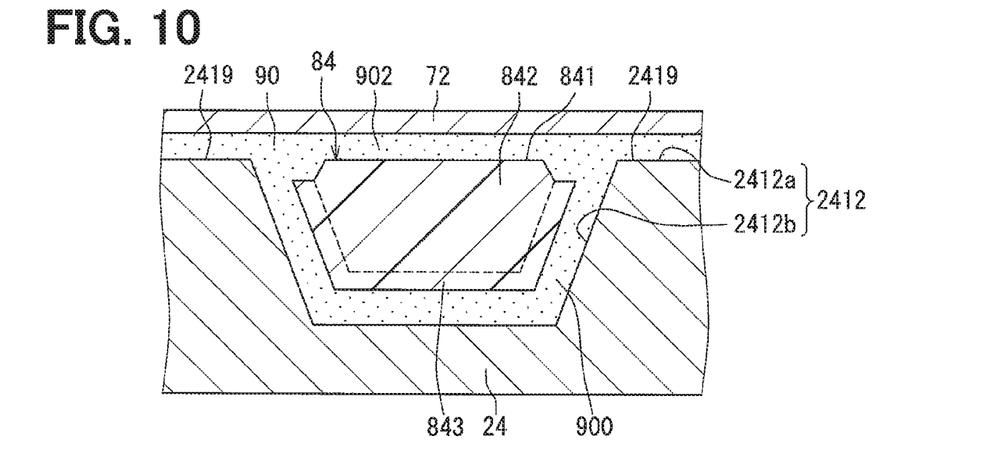
FIG. 10 is a sectional view showing an actuating device, this sectional view corresponding to the line X-X in FIG. 5.

As shown in FIGS. 5, 6, and 9, the contact 86 includes multiple terminals 860 and a housing 861. The terminals 860 are formed of a conductive material, such as phosphor bronze. The housing 861 contains resin as its formation material and supports the terminals 860. The housing 861 is mainly located on the side of the rear side 781 of the printed circuit board 78. The terminal 860 is soldered at the one-end in the state where the terminal 860 is inserted in the through hole 787 of the printed circuit board 78. The terminal 860 is welded at the other-end to the joint portion 480 of the winding 48 of the motor 20. The terminal 860 electrically relays the three-phase output lines of the inverter, which is formed in the circuit board 74, with the windings 48 of the motor 20.

As shown in FIG. 9, the housing 861 includes the body portion 862 and the protrusions 863 and 864. The body portion 862 holds and positions the terminals 860. The protrusions 863 and 864 are projected from the body portion 862 toward the base 24.

The protrusions 863 and 864 interpose ends of the terminals 860, which are connected to the printed circuit board 78, therebetween. As shown in FIG. 6, the printed circuit board 78 has through holes 788 and 789 correspondingly to the protrusions 863 and 864. The protrusion 863 is inserted in the through hole 788. The protrusion 864 is inserted in the through hole 789. In this way, the contact 86 is positioned relative to the circuit board 74 (printed circuit board 78).

As shown in FIG. 4, the rear side 2405 of the base 24 has a sixth recessed portion 2418, which is formed correspondingly to a part of body portion 862 of the contact 86. The sixth recessed portion 2418 is equipped with a sealing member (not shown). The contact 86 is adhered and affixed to the base 24 via the sealing member. In this way, even in a case where vibration of the motor 20 is transmitted to the actuating device 70, which is integrated with the motor 20, the present configuration enables to restrict the circuit board 74, which is equipped with the contact 86 and the contact 86, from vibrating. Therefore, the present configuration enables to enhance vibration-proof property of the device. In addition, the contact 86 is also affixed to the base 24 at the time point when the connector 84 is affixed. Accordingly, the sealing member, which affixes the contact 86, may employ the same construction material as that of, for example, the first seal portion 900 and/or the second seal portion 901, which will be described later.

The actuating device 70 further includes the heat dissipation gel 88 and a sealing member 90. The heat dissipation gel 88 is a thermal conduction member having a flexibility. The heat dissipation gel 88 is formed of, for example, a silicone-based material and may contain additive such as metal oxide to enhance a thermal conductivity. The additive may be, for example, zinc oxide. Other than the heat dissipation gel 88, for example, a heat dissipation grease may be used as the thermal conduction member. The heat dissipation gel 88 is interposed between the circuit board 74 and the case 76 in the thickness direction of the printed circuit board 78. The heat dissipation gel 88 is in contact with both the circuit board 74 and the case 76. The heat dissipation gel 88 is interposed between the circuit board 74 and the case 76 at multiple locations. In FIG. 6, the dashed line shows the outline of the heat dissipation gel 88 applied to the circuit board 74.

In present embodiment, the heat dissipation gel 88 is interposed between the one side 780 of the printed circuit board 78 and the base 24. The heat dissipation gel 88 includes first thermal conductive portions 880, 881, and 882 and a second thermal conductive portion 883. The first thermal conductive portion 880 is interposed between the MOSFETs 800 and a bottom surface of the fifth recessed portion 2413, which is formed in the base 24 correspondingly to the MOSFETs 800. The first thermal conductive portion 880 is further interposed between circumference portions of the MOSFETs 800 in the one side 780 and the bottom surface of the fifth recessed portion 2413. The first thermal conductive portion 881 is interposed between the driver IC 801 and the fifth recessed portion 2413, which is formed in the base 24 corresponding to the driver IC 801. The first thermal conductive portion 881 is further interposed between a circumference portion of the driver IC 801 in the one side 780 and the fifth recessed portion 2413. The first thermal conductive portion 882 is interposed between mounting portions of the terminals 840 and 860 in the printed circuit board 78 and the base 24. The first thermal conductive portion 882 is further interposed between circumference portions of the mounting portions, i.e., circumference portions of the through holes 783 and 784 and the base 24. First thermal conductive portions 880, 881, and 882 mainly conduct heat of the circuit board 74 to the base 24.

The second thermal conductive portions 883 are formed of the same construction material as those of the first thermal conductive portions 880, 881, and 882. The second thermal conductive portions 883 are interposed between the case 76 and the first thermal conductive portions 880, 881, and 882, respectively, at different positions. The second thermal conductive portions 883 regulate vibration of the circuit board 74 mainly with its damper effect. In the present embodiment, the second thermal conductive portions 884 are interposed between the base 24 and mounting regions of the coil 802 and the capacitor 803, which are tall components, in the one side 780 of the printed circuit board 78, respectively.

The sealing member 90 water-tightly seals the accommodation space of the case 76. The sealing member 90 may be also used as an adhesion material. In the present embodiment, the sealing member 90 is formed as an adhesion material, which contains silicone as a main component. The sealing member 90 is applied by using, for example a dispenser.

Figure 11:
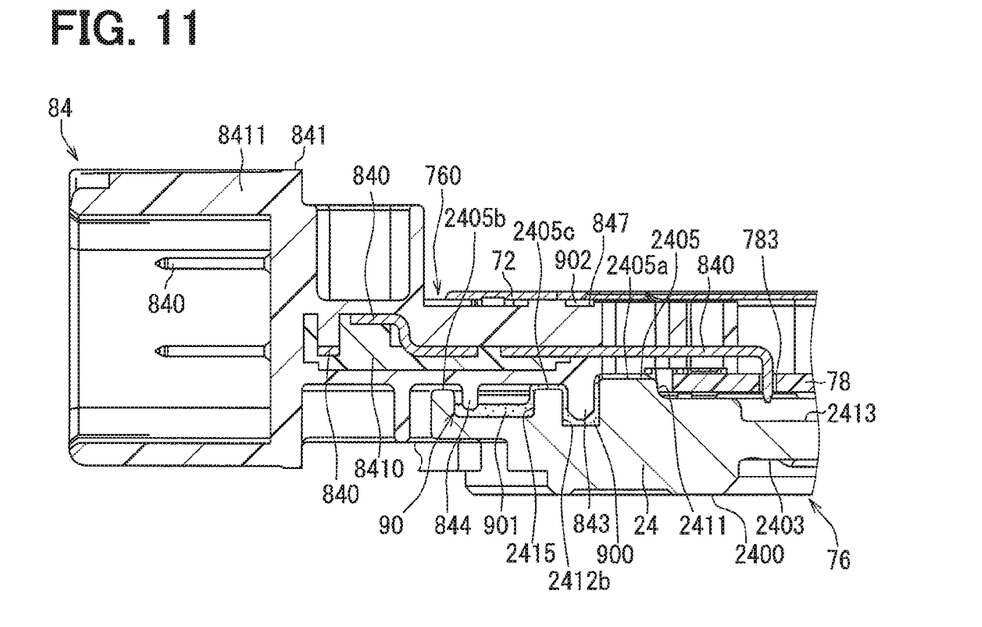
FIG. 11 is a sectional view showing the actuating device, this sectional view corresponding to the line XI-XI in FIG. 5.

Subsequently, a sealing configuration of the case 76 and a vibration regulating configuration of the connector 84 will be described with reference to FIGS. 4, 5, 10, and 11. FIG. 11 is a sectional view showing the actuating device 70 taken along the line XI-XI in FIG. 5. That is, FIG. 11 shows a cross section also including the cover 72. In FIG. 11, illustration of solder, which is for connecting the terminal 840 with the printed circuit board 78, is omitted.

As shown in FIGS. 4 and 5, an inner groove portion 2412 is formed in the outer periphery portion 2410 in the rear side 2405 of the base 24. The inner groove portion 2412 is formed to surround the circuit board 74 and a joint portion between the circuit board 74 and the motor 20. The inner groove portion 2412 includes a cover-opposed portion 2412a and a connector-opposed portion 2412b. The cover-opposed portion 2412a is opposed to the cover 72. The connector-opposed portion 2412b is opposed to the housing 841 of the connector 84. The connector-opposed portion 2412b may be equivalent to an inserted portion. The connector-opposed portion 2412b is extended in an extended direction, in which the width of the connector opposed portion 2412b is substantially constant. The extended direction is perpendicular to the array direction of the terminals 840 along which the terminals 840 are arranged.

The sealing member 90 is equipped to extend throughout the total length of the inner groove portion 2412. As shown in FIG. 10, the sealing member 90, which is equipped to the cover-opposed portion 2412a, is tightly in contact with both the base 24 and the cover 72. The sealing member 90, which is equipped to the connector-opposed portion 2412b, is tightly in contact with the connector-opposed portion 2412b and the base 24. The connector-opposed portion 2412b is inserted in the first projected portion 843.

In the present embodiment, the inner groove portion 2412 is not in an annular shape. The inner groove portion 2412 forms a clearance with the cover-opposed portion 2412a and the connector-opposed portion 2412b. The base 24 has a seventh recessed portion 2419 in order to connect the sealing member 90, which is equipped to the cover opposed portion 2412a, and the sealing member 90, which is equipped to the connector opposed portion 2412b. In the projection view along the axial direction, the seventh recessed portion 2419 contains the connector-opposed portion 2412b and the outer groove portion 2415. The connector-opposed portion 2412b and the outer groove portion 2415 are equipped to the bottom surface of the seventh recessed portion 2419. The bottom surface of the seventh recessed portion 2419 is substantially flush with respect to the bottom surface of the cover opposed portion 2412a. That is, the bottom surface of the seventh recessed portion 2419 is substantially at the same plane as the bottom surface of the cover opposed portion 2412a. Therefore, the seventh recessed portion 2419 is enabled to receive a portion of the sealing member 90, which overflows from the Inner groove portion 2412.

As shown in FIG. 10, the sealing member 90 is further equipped to the seventh recessed portion 2419. The sealing member 90, which is equipped to the seventh recessed portion 2419, is connected with both the sealing member 90, which is equipped to the cover-opposed portion 2412a, and the sealing member 90, which is equipped to the connector-opposed portion 2412b.

As shown in FIG. 5, the housing 841 of the connector 84 has an opposed surface, which is opposed to the cover 72. The opposed surface of the housing 841 has a groove portion 847. The groove portion 847 is extended, similarly to the first projected portion 843, along the array direction of the terminals 840. The sealing member 90 is further equipped to the groove portion 847. The sealing member 90, which is equipped to the groove portion 847, is, at both ends in the groove portion 847, connected with the sealing member 90, which is equipped to the seventh recessed portion 2419, and the sealing member 90, which is equipped to the connector-opposed portion 2412b. In this way, the accommodation space of the case 76 is sealed water tightly with the sealing member 90.

As shown in FIG. 11, the sealing member 90 is further equipped to the outer groove portion 2415. The outer groove portion 2415 is formed in an opposite portion of the rear side 2405 of the base 24, which is opposed to the housing 841. The outer groove portion 2415 is located outside the connector-opposed portion 2412b of the inner groove portion 2412. The outer groove portion 2415 is formed only in the opposed portion, which is opposed to the housing 841, in the surroundings of the inner groove portion 2412. The outer groove portion 2415 is formed in the periphery portion of the opening 760 in the base 24. The sealing member 90 is equipped to the outer groove portion 2415. The sealing member 90 is tightly in contact with the second projected portion 844, which is inserted in the outer groove portion

2415. In the present embodiment, the outer groove portion 2415 is in a non-regular shape, which is not constant in the width, in a plane view.

A portion of the sealing member 90 is equipped to the connector-opposed portion 2412b of the inner groove portions 2412. The portion of the sealing member 90 includes a first seal portion 900 and a second seal portion 901. The first seal portion 900 is in contact with the first projected portion 843. The second seal portion 901 is formed of the same construction material as that of the first seal portion 900. The second seal portion 901 is equipped to the outer groove portion 2415 and is in contact with the second projected portion 844. The sealing member 90 includes a third seal portion 902, which is tightly in contact with the cover 72. The third seal portion 902 includes a portion, which is equipped to the groove portion 847, a portion, which is equipped to the cover-opposed portion 2412a of the inner groove portions 2412, and a portion, which is equipped to the seventh recessed portion 2419. The accommodation space of the case 76 is water-tightly sealed with the first seal portion 900 and the third seal portion 902.

In the present embodiment, the sealing member 90, which forms the first seal portion 900 and the second seal portion 901, is formed of the adhesion material having a thermally hardening property and containing silicone as a main material. The sealing member 90 is softened in its thermally hardening process. To the contrary, the sealing member 90, which forms the third seal portion 902, is formed of an adhesion material having a humidity hardening property and containing silicone as a main material.

More specifically, the sealing member 90 having the thermally hardening property is applied to the connector-opposed portion 2412b of the base 24 and an application region 903, before the circuit board 74, which is mounted with the connector 84, is affixed to the base 24. The application region 903 is shown by the one-point chain line in FIG. 4. The application region 903 is a part of the intermediate surface 2405c. When the circuit board 74 is affixed to the base 24, the sealing member 90, which is applied to the application region 903 and located between the base 24 and the connector 84, is pushed to flow into the outer groove portion 2415. In this way, the sealing member 90 is equipped to the outer groove portion 2415. It is noted that, the sealing member 90, which has a thermally hardening property, may be directly applied into the outer groove portion 2415.

After the affixation of the circuit board 74, the sealing member 90, which has a humidity hardening property, is applied to the cover-opposed portion 2412a, the seventh recessed portion 2419, and the groove portion 847 of the base 24, before the cover 72 is mounted onto the base 24. More specifically, the sealing member 90 having the humidity hardening property is applied in an annular form to surround the circuit board 74 and the joint portion between the circuit board 74 and the motor 20. Subsequently, the cover 72 is mounted to the base 24 after the application of the sealing member 90. In this way, the first seal portion 900 and the second seal portion 901 are formed first, and subsequently, the third seal portion 902 is formed.

As shown in FIG. 11, the rear side 2405 includes an inner surface 2405a, an outer surface 2405b, and an intermediate surface 2405c. The inner surface 2405a is a portion connected with the inner side of the connector-opposed portion 2412b. The outer surface 2405b is a portion connected to the outer side of the outer groove portion 2415 on the side of the opening 760. The intermediate surface 2405c is a portion connected to the outer side of the connector-opposed portion 2412b. The intermediate surface 2405c is a portion between the connector-opposed portion 2412b and the outer groove portion 2415.

In the present embodiment, the intermediate surface 2405c is at a position lower than the inner surface 2405a with respect to the bottom surface of the connector-opposed portion 2412b, which is a reference of the height. The position of the outer surface 2405b may be at a position substantially the same as the height of the intermediate surface 2405c or may be at a position higher than the intermediate surface 2405c. The outer groove portion 2415 has a widest portion in the above-described width direction. The widest portion of the outer groove portion 2415 is wider than the connector-opposed portion 2412b in the width direction. The center of the second projected portion 844 is located at the position outside the center of the widest portion of the outer groove portion 2415 in the width direction.

The connector-opposed portion 2412b is deeper than the outer groove portion 2415 with respect to the intermediate surface 2405c as a reference of the depth. Furthermore, the second projected portion 844 is thinner than the first projected portion 843.

In the present embodiment, as shown in FIG. 11, the housing 841 includes the primary molded portion 8410 and the secondary molded portion 8411. That is, the housing 841 is formed in two stages.

Subsequently, effects of the motor device 16 according to the present embodiment will be described.

As shown in FIG. 11, a part of the connector 84 is projected from the opening 760 of the case 76. The projected portion of the connector 84, which is projected from the opening 760, is formed as a large component in consideration of its fitting property of a connector (female connector) of an external device. In a conventional configuration, the connector is affixed to the base only at the first seal portion, which water tightly seals the accommodation space. In the conventional configuration, the connector has a long portion extended from the first seal portion on the side of connection with an external device, and therefore, the connector is supported in a cantilever configuration. Therefore, in a case where vibration of the motor transmits to the connector via the base and the first seal portion, the connector may vibrate, and consequently, ablation may arise in the terminal.

To the contrary, according to the present embodiment, the base 24 has the inner groove portion 2412 and the outer groove portion 2415. In addition, the housing 841 of the connector 84 includes the first projected portion 843 and the second projected portion 844. The outer groove portion 2415 is formed at the outside of the connector-opposed portion 2412b of the inner groove portion 2412. The sealing member 90 is equipped to both the inner groove portion 2412 and the outer groove portion 2415. The first projected portion 843 is inserted in the connector-opposed portion 2412b of the inner groove portions 2412. In this way, the first projected portion 843 is affixed to the base 24 via the first seal portion 900, which is the sealing member 90. In addition, the second projected portion 844 is inserted in the outer groove portion 2415. In this way, the second projected portion 844 is affixed to the base 24 via the second seal portion 901, which is the sealing member 90.

As described above, the connector 84 is affixed to the base 24 by the first seal portion 900, which is a part of the seal portion water tightly sealing the accommodation space, and further additionally by the second seal portion 901. Therefore, the present configuration enables to increase the adhesion area of the connector 84 with the base 24 via the sealing member 90, compared with a configuration, which does not include the second projected portion 844, the outer groove portion 2415, and the second seal portion 901. In addition, the second seal portion 901 is equipped on the outside of the first seal portion 900. That is, the second seal portion 901 is equipped at a position closer to the projected portion, which is projected from the opening 760 of the case 76, than the first seal portion 900. The present configuration as described above enables to regulate vibration of the connector 84 even in a case where vibration of the motor 20 is transmitted to the connector 84 via the base 24.

In addition, the second seal portion 901 is formed of the same construction material as that of the first seal portion 900. Therefore, the present configuration enables to apply the sealing member 90 in the same process to form the first seal portion 900 and the second seal portion 901. Thus, the present configuration enables to regulate vibration of the connector 84 without causing increase in the number of components and without increase in the manufacturing process. That is, vibration of the connector 84 can be regulated with the present simple configuration.

In addition, according to the present embodiment, the intermediate surface 2405c is at the position lower than that of the inner surface 2405a. Therefore, in a case where the sealing member 90 is softened in the thermal hardening process and is caused to overflow from the connector-opposed portion 2412b, the present configuration leads the overflowing sealing member 90 toward the intermediate surface 2405c. Therefore, the present configuration enables the outer groove portion 2415 to receive the overflowing sealing member 90. Thus, the present configuration enables to restrict the sealing member 90 from overflowing toward the inner surface 2405a, i.e., from overflowing toward the circuit board 74. Thus, the outer groove portion 2415 also exhibits a function as a dike to accumulate the overflowing sealing member 90. According to the present embodiment, as shown in FIG. 11, the first seal portion 900 and the second seal portion 901 are connected to each other. The sealing member 90 is further equipped to the upper side of the intermediate surface 2405c. The sealing member 90 is tightly in contact with the intermediate surface 2405c and the housing 841. The present configuration enables to further increase the adhesion area between the connector 84 and the base 24 via the sealing member 90.

The position of the outer surface 2405b is substantially the same as the position of the intermediate surface 2405c or is higher than the position of the intermediate surface 2405c. In the present embodiment, the outer surface 2405b and the intermediate surface 2405c are substantially at the same height. Therefore, the present configuration enables to restrict the sealing member 90 being in a softened state from overflowing from the inside of the outer groove portion 2415 to the outside of the outer groove portion 2415. That is, the present configuration enables to restrict the sealing member 90 from dripping down at the opening 760 to the outside of the case 76 resulting in, for example, adhering onto a production line of the device.

In addition, according to the present embodiment, the widest portion of the outer groove portion 2415 is larger in the width than the connector-opposed portion 2412b in the width direction. Thus, the width of the outer groove portion 2415 is set large in this way. Therefore, the present configuration enables the outer groove portion 2415 to receive the sealing member 90 even in a case where a large amount of the sealing member 90 overflows from the connector-opposed portion 2412b.

In particular, according to the present embodiment, the center of the second projected portion 844 is located at the position outside the center of the widest portion of the outer groove portion 2415 in the width direction. Thus, the second projected portion 844 is located in the outer groove portion 2415 at the position close to the opening 760 in this way. Therefore, the present configuration enables to elongate the length between the first projected portion 843 and the second projected portion 844. That is, the present configuration enables to increase the distance between affixed points at which the connector 84 is affixed to the base 24 via the sealing member 90. Therefore, the present configuration enables to effectively regulate vibration of the connector 84.

In addition, according to the present embodiment, the connector-opposed portion 2412b is deeper than the outer groove portion 2415. Therefore, the present configuration enables to secure a large seal length with a narrow width. That is, the present configuration enables to elongate a leak path of the sealing member 90.

In addition, according to the present embodiment, the second projected portion 844 is thinner than the first projected portion 843. The present configuration enables to reduce the volume, by which the second projected portion 844 occupies in the outer groove portion 2415. Therefore, the present configuration enables to increase the amount of the sealing member 90, which is accommodated in the outer groove portion 2415.

Furthermore, the motor device 16 according to the present embodiment enables to produce the following effects.

According to the present embodiment, the fifth recessed portion 2413 is formed in the rear side 2405 of the base 24 correspondingly to the MOSFETs 800. In addition, the first thermal conductive portion 880 is located in the fifth recessed portion 2413 while being in contact with the MOSFETs 800. The fifth recessed portion 2413 enables to restrict movement of the first thermal conductive portion 880 (heat dissipation gel 88) and to maintain the MOSFETs 800 at the corresponding predetermined positions. Therefore, the present configuration enables to dissipate heat of the MOSFETs 800 efficiently to the base 24 via the first thermal conductive portion 880. In addition, the present configuration enables to reduce the size of the motor device 16 in the axial direction. In particular, according to the present embodiment, a part of the MOSFETs 800 is located in the fifth recessed portion 2413 in the axial direction, thereby to enable to further downsize the motor device 16.

In addition, according to the present embodiment, the third recessed portion 2408 is formed on the one side 2400 of the base 24. The sensor magnet 36 is accommodated in the third recessed portion 2408. Therefore, the present configuration enables to reduce the size of the motor device 16 in the axial direction.

In addition, according to the present embodiment, the first recessed portion 2402 is formed on the one side 2400 of the base 24. The one end of the motor axis 30 and the bearing 28 are accommodated in the first recessed portion 2402. The printed circuit board 78 is substantially in the crank form to circumvent the bearing 28 and the motor axis 30. In addition, the printed circuit board 78 is located on the side of the rear side 2405 such that the printed circuit board 78 does not overlap with the first recessed portion 2402 in the projection view along the axial direction. According to the present configuration, the printed circuit board 78 does not overlap with the bearing 28 and the motor axis 30 in the projection view along the axial direction in this way. Therefore, the motor device 16 can be downsized.

In addition, according to the present embodiment, the multiple second recessed portions 2403 and the multiple reinforcement portions 2404 are formed in the one side 2400 of the base 24. The second recessed portions 2403 accommodate the winding 48, respectively. The present configuration enables to downsize the motor device 16 in the axial direction. In addition, the second recessed portions 2403 and the reinforcement portions 2404 are arranged alternately in the circumferential direction. Therefore, the present configuration enables to enhance the rigidity of the base 24 while enabling to downsize the motor device 16, compared with a configuration where an annular second recessed portion 2403 is formed.

In addition, according to the present embodiment, the MOSFETs 800 and the driver IC 801 are equipped to circumvent the sensor magnet 36 in the projection view along the axial direction. In addition, the fifth recessed portions 2413 are formed correspondingly to the MOSFETs 800 and the driver IC801, respectively. That is, the third recessed portion 2408, which accommodates the sensor magnet 36, and the fifth recessed portion 2413 corresponding to MOSFET 800 and driver IC801 are equipped in the base 24 such that the third recessed portion 2408 and the fifth recessed portion 2413 do not overlap with each other in the projection view along the axial direction. Therefore, the present configuration enables to further downsize the motor device 16 in the axial direction.

In addition, according to the present embodiment, the protrusion 845 of the connector 84 is inserted in the hole portion 2416 of the base 24. Therefore, the present configuration enables to position the connector 84 relative to the base 24 (case 76) with sufficient accuracy. That is, the present configuration enables to restrict positional deviation of the connector 84 (housing 841) relative to the connector-opposed portion 2412b. Therefore, the present configuration enables to restrict the sealing member 90 from being inclined.

In addition, the protrusion 845 of the connector 84 is inserted through the through hole 784 of the printed circuit board 78 and is further inserted into the hole portion 2416 of the base 24. At the present positioning location, the position of the circuit board 74 relative to the base 24 is determined via the protrusion 845. It is further noted that, the protrusion 2417, which is equipped to the base 24, is inserted into the through hole 786 of the printed circuit board 78. At the present positioning location, the position of the circuit board 74 relative to the base 24 is determined without via the connector 84. In this way, the circuit board 74 is positioned at the two locations. Therefore, the present configuration enables to restrict the positional deviation of the circuit board 74 additionally in the rotational direction. Therefore, the present configuration enables to position the hall element 805, which is mounted on the printed circuit board 78, to be opposed to the sensor magnet 36 through the through hole 2414, which is formed in the base 24, with sufficient accuracy. That is, the present configuration enables to detect the rotation angle of the motor 20 with sufficient accuracy.

Furthermore, according to the present embodiment, the through hole 786, in which the protrusion 2417 of the base 24 is inserted, is in the elongated hole shape. The through hole 786 is in the elongated hole shape in which the circumferential length (width), which is the length in the circumferential direction centered on the through hole 784, is larger than the radial length (height), which is in the radial direction centered on the through hole 784. The present configuration enables to restrict the positional deviation in the circumferential direction, while permitting, in the radial direction, an assembly error of the printed circuit board 78 relative to the base 24, a product dimensional tolerance, and/or an alpha difference of each of and/or the combination of the printed circuit board 78 relative to the base 24.

In addition, in the present embodiment, the through hole 784 is formed on the one-end side in the printed circuit board 78, and the through hole 786 is formed on the other-end side in the printed circuit board 78 in the longitudinal direction of the printed circuit board 78. The present configuration enables to elongate the distance between the through holes 784 and 786 for positioning the circuit board 74 relative to the base 24. Therefore, the present configuration enables to position the circuit board 74 relative to the base 24 with more sufficient accuracy.

Second Embodiment

The present embodiment may refer to the precedence embodiment(s). Accordingly, a description, which is common to that of the motor device 16 in the precedence embodiment(s), will be omitted.

Figure 12:
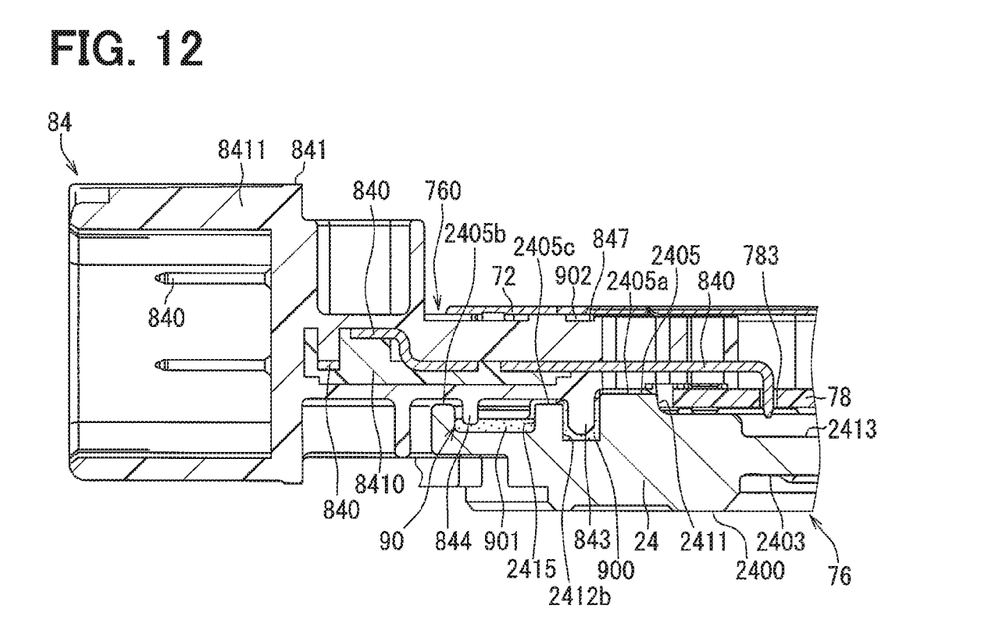
FIG. 12 is a sectional view showing an actuating device of a motor device according to a second embodiment, this sectional view corresponding to FIG. 11.

According to the present embodiment, as shown in FIG. 12, the first seal portion 900 and the second seal portion 901 are not connected to each other. That is, the first seal portion 900 and the second seal portion 901 are separated from each other. The present configuration also enables to restrict vibration of the connector 84 with a simple configuration, similarly to the first embodiment. FIG. 12 corresponds to FIG. 11.

In FIG. 12, the intermediate surface 2405c is at the position lower than the inner surface 2405a. It is noted that, the intermediate surface 2405c may be substantially the same as the inner surface 2405a in the height. It is further noted that, the intermediate surface 2405c may be at the position higher than the inner surface 2405a.

The disclosure is not limited to the embodiments as exemplified above. The disclosure includes embodiments and modifications made by a person skilled in the art based on the embodiments. For example, the disclosure is not limited to combinations of the elements shown in the embodiments. The disclosure can be reduced in practice with various combinations. The technical scope of the present disclosure is not limited to the description of the embodiments. The technical scope as disclosed should be understood to incorporate various modifications.

In the above embodiments, the valve timing control apparatus 10 controls the valve timing of the intake valve. It is noted that, the valve timing control apparatus 10 may be applicable to a device, which controls a valve timing of an exhaust valve, as a movable valve, and to a device, which controls valve timings of both the intake valve and the exhaust valve, as movable valves.

In the embodiments, the hall elements 805 are shown as an example of a magnetoelectric conversion element, which detects the rotation angle of the motor 20. It is noted that, the magnetoelectric conversion element may employ, for example, a magneto-resistive effect element.

The connection structure between the three-phase output lines and the windings 48 in the inverter of the circuit board 74 is not limited to the contact 86. The connection structure may employ another electric connection structure than the contact 86.

In the above embodiments, the motor device 16 is used for the valve timing control apparatus 10. The motor device 16 may be applied to another motor device.

The inner groove portion 2412 in an annular shape may be also employable. That is, a configuration, in which the cover-opposed portion 2412a and the connector-opposed portion 2412b are connected to each other, may be also employable.

The first seal portion 900, the second seal portion 901, and the third seal portion 902 may employ the same material as that of the sealing member 90.

The motor device includes the case 76, the motor 20, the circuit board 74, the connector 84, and the sealing member 90. The case 76 includes the metallic base 24 and the cover 72. The cover 72 forms the accommodation space with the base. The case 76 has the opening 760 formed by the base and the cover. The motor 20 is located at the one side 2400 of the base. The circuit board 74 includes the printed circuit board 78 and the electronic component 80. The printed circuit board 78 is located in the accommodation space and is affixed to the rear side 2405 of the base on the opposite side of the one side. The electronic component 80 is mounted on the printed circuit board. The circuit board 74 is electrically connected with the motor. The connector 84 includes multiple terminals 840 and the housing 841. The terminals 840 are mounted on the printed circuit board. The housing 841 supports the terminals and partially projecting through the opening to the outside. The sealing member 90 is interposed at the opposed portion between the base and the cover and at the opposed portion between the periphery of the opening of the case and the housing. The base includes the inner groove portion 2412 and the outer groove portion 2415. The inner groove portion 2412 is formed in the rear side to surround the circuit board and the connecting portion between circuit board and the motor. The outer groove portion 2415 is formed in the rear side outside the inner groove portion. The outer groove portion 2415 is formed at the opposed portion of the base to the housing. The housing has the first projected portion 843 and the second projected portion 844. The first projected portion 843 is inserted in the inserted portion 2412b of the inner groove portion. The inserted portion 2412b is opposed to the housing. The second projected portion 844 is inserted in the outer groove portion. The sealing member includes the first seal portion 900 and the second seal portion 901. The first seal portion 900 is equipped to the inserted portion and is in contact with the first projected portion to water tightly seal the accommodation space. The second seal portion 901 is formed of the material same as the material of the first seal portion. The second seal portion 901 is equipped to the outer groove portion and is in contact with the second projected portion to restrict vibration of a connector.

In the present configuration, the housing of the connector includes the first projected portion and the second projected portion. The first projected portion is inserted in the inserted portion of the inner groove portion and is in contact with the first seal portion serving as the sealing member. The second projected portion is inserted in the outer groove portion, which is equipped to the opposed portion, which is opposed to the housing and located outside the inner groove portion. The second projected portion is in contact with the second seal portion serving as the sealing member.

In this way, the first projected portion is affixed to the base via the first seal portion. In addition, the second projected portion is affixed to the base via the second seal portion. The connector is affixed to the base not only by the first seal portion, which is to water tightly seal the accommodation space, but also by the second seal portion. Therefore, the present configuration enables to increase the adhesion area between the connector and the base via the sealing member, compared with a configuration, which does not include the second projected portion, the outer groove portion, and the second seal portion. In addition, the present configuration includes the second seal portion, which is equipped to the portion of the connector, which is projected from the opening of the case, at the position closer than the first seal portion. The present configuration as described above enables to regulate vibration of the connector even in a case where vibration of the motor is transmitted to the base.

In addition, according to the present configuration, the second seal portion is formed of the material same as the material of the first seal portion. Therefore, the present configuration enables to regulate vibration of the connector, without increase in the number of components and without increase in the manufacturing process. That is, the present simple configuration enables to regulate vibration of the connector.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A motor device comprising:
   a case including a base and a cover, the base formed of a metallic material having a one side and a rear side, which is on an opposite of the one side, the cover defining an accommodation space with the base, the base and the cover defining an opening of the case;
   a motor located at the one side of the base;
   a circuit board located in the accommodation space and electrically connected with the motor, the circuit board including a printed circuit board and an electronic component, which is mounted on the printed circuit board;
   a connector including a plurality of terminals and a housing, the terminals mounted on the printed circuit board, the housing supporting the terminal and partially projecting through the opening of the case to an outside; and
   a sealing member interposed at an opposed portion between the base and the cover and at an opposed portion between a periphery of the opening of the case and the housing of the connector, wherein
   the base includes an inner groove portion and an outer groove portion,
   the inner groove portion is formed in the rear side of the base to surround both the circuit board and a connecting portion between the circuit board and the motor,
   the outer groove portion is formed in the rear side of the base and located outside the inner groove portion,
   the outer groove portion is located at an opposed portion at which the base is opposed to the housing of the connector,
   the housing of the connector includes a first projected portion and a second projected portion, the first projected portion is inserted in an inserted portion of the inner groove portion, which is opposed to the housing, the second projected portion is inserted in the outer groove portion, the sealing member includes a first seal portion and a second seal portion, which are formed of a same material, the first seal portion is equipped to the inserted portion and is in contact with the first projected portion to water-tightly seal the accommodation space, and the second seal portion is equipped to the outer groove portion and is in contact with the second projected portion to restrict vibration of the connector.

2. The motor device according to claim 1, wherein the inserted portion has a bottom surface defining a reference of a height, the base has a first portion and a second portion, the first portion is located between the inserted portion and the outer groove portion and is connected with an outer side of the inserted portion, the second portion is connected with an inner side of the inserted portion, and the first portion is lower than the second portion.

3. The motor device according to claim 1, wherein in a width direction, which is perpendicular to an extended direction of the inserted portion, the outer groove portion has a widest portion having a largest width, and the widest portion is wider than the inserted portion.

4. The motor device according to claim 3, wherein a center of the second projected portion is located outside a center of the widest portion of the outer groove portion in the width direction.

5. The motor device according to claim 1, wherein the rear side of the base has a portion located between the inserted portion and the outer groove portion and defines a reference of a depth, and the inserted portion is deeper than the outer groove portion.

6. The motor device according to claim 1, wherein in a width direction perpendicular to an extended direction of the inserted portion, the second projected portion is thinner than the first projected portion.

7. The motor device according to claim 1, wherein the motor device is equipped to a valve timing control apparatus configured to control a valve timing of an internal combustion engine by using rotation of the motor.

* * * * *